United States Patent [19]
Harada et al.

[11] Patent Number: 5,847,997
[45] Date of Patent: Dec. 8, 1998

[54] PC CARD

[75] Inventors: Masaaki Harada; Yoshinori Yoshioka, both of Suwa, Japan

[73] Assignee: Seiko Epson Corporation, Japan

[21] Appl. No.: 732,164

[22] Filed: Oct. 16, 1996

[30] Foreign Application Priority Data

Oct. 16, 1995 [JP] Japan .................................. 7-267516
Oct. 8, 1996 [JP] Japan .................................. 8-267554

[51] Int. Cl.[6] .................................................. G11C 16/02
[52] U.S. Cl. ........................................ 365/185.33; 365/52
[58] Field of Search ...................... 365/185.33, 185.11, 365/52, 63; 235/492, 380, 379

[56] References Cited

U.S. PATENT DOCUMENTS 5,473,765  12/1995  Gibbons ................................ 395/500
5,627,783   5/1997  Miyauchi ......................... 365/185.33
5,644,539   7/1997  Yamagami ............................ 365/200

*Primary Examiner*—David C. Nelms
*Assistant Examiner*—Son Mai
*Attorney, Agent, or Firm*—Harness, Dickey & Pierce, P.L.C.

[57] ABSTRACT

A PC card is provided through which data can be read and written at a high speed. When a system main unit reads data of one sector from a flash memory of the PC card, the relevant data of one sector from among the data of one block including the relevant data is written in a first RAM, and data of the other sectors is written in a second RAM. Since the system main unit can perform data input/output between it and the high-speed first RAM, the reading and writing speed of data is increased. If the first RAM is contained in a control apparatus and the data is allocated to the first RAM and the second RAM on the basis of the value of the register, it is possible to perform data input/output with ease.

12 Claims, 4 Drawing Sheets

PC CARD

BACKGROUND OF THE INVENTION

1. Field of the Invention

The present invention relates to a PC card having a flash memory and, more particularly, to a PC card in which the speed of data input/output to and from a flash memory is increased.

2. Description of the Related Art

Generally speaking, a PC card has a large-capacity storage element, such as a flash memory. Since flash memory elements are non-volatile and can store data for a long period of time, they have come to be used in electronic cameras, computer systems, and so on as a recording medium in place of film or magnetic disks.

Such a conventional PC card is shown by reference numeral 30 of FIG. 6.

The PC card 30 has a control element 33, a flash memory 31, and a general-purpose RAM 32. The PC card 30 is releasably connected to a system main unit 35 by a connector (not shown).

The control element 33 inputs and outputs various signals, such as data signals, address signals, or control signals to and from the system main unit 35. The control element 33 is also structured to be capable of transmitting and receiving data between it and the system main unit 35 by controlling the flash memory 31 for storing data and the general-purpose RAM 32 for temporarily storing data.

This PC card 30 is used as an external storage device in place of a hard disk unit. Therefore, the PC card 30 must be made to be capable of reading and writing data by the same access method as that for the hard disk when seen from the system main unit 35 side.

In a case in which 256 bytes×2=512 bytes are assumed to be one sector and one sector×8=4096 bytes to be one block, generally speaking, hard disks are structured in such a way that byte-by-byte data input/output is not performed and data is read or written by collectively handling a data amount equal to one sector. Therefore, it is preferable that the PC card 30 be structured so as to be capable of reading and writing in units of data contained in one sector.

However, since the input/output of a flash memory is performed in units of one block rather than in units of one sector, when it is desired to read or write data of one sector, it is necessary to read once all of the data in one block including the data of one sector thereof.

Therefore, hitherto, in response to a data read request from the system main unit 35 side, the control element 33 once copies all of the data of the relevant one block to the general-purpose RAM 32, and then reads data from the general-purpose RAM 32 again and outputs it to the system main unit 35.

When a request for rewriting data within the flash memory 31 is issued from the system main unit 35, similarly to that described above, the control element 33 once copies all data of one block including the relevant sector to the general-purpose RAM 32, after which it rewrites data in the general-purpose RAM 32 in accordance with the data input from the system main unit 35, then the whole data of one block is written into the flash memory 31 again to rewrite the data of the flash memory 31.

FIG. 7 shows the image of storage areas 41 and 42 of the flash memory 31 and the general-purpose RAM 32. The capacity of the storage area 41 of the flash memory 31 must have a size capable of serving as an alternate storage of a hard disk, whereas the general-purpose RAM 32 needs only a capacity capable of temporarily storing data for one block.

As described above, in the conventional PC card 30, even when it is desired to read or write data of one byte, all data of one block must be copied once to a second RAM, and data must be input or output between the system main unit and the general-purpose RAM 32 via a control element. For this reason, data reading and writing speed is low, and a demand for higher reading and writing cannot be satisfied.

The present invention has been designed to solve the disadvantages of the above-described prior art. An object of the present invention is to provide a PC card in which data can be read and written at a high speed.

To achieve the above-described object, according to one aspect of the present invention, there is provided a PC card which, when a predetermined amount of data is assumed to be one sector and an amount of data of a multiple of integer of the one sector to be one block, has a flash memory structured to perform data input/output in units of the amount of data of the one block and which is structured so as to be capable of performing data input/output in units of the amount of data of one sector, wherein there is provided a first RAM in which reading and writing can be performed in an amount of data smaller than that of the one block and a second RAM having a storage capacity for the one block or more, data of one block including data for which a read request has been issued is read from the flash memory, a predetermined amount of data including data for which the read request has been issued in the data of that one block is copied to the first RAM, the other remaining data is copied to the second RAM, and data of one sector including data for which a read request has been issued is output from the first RAM to a system main unit.

According to another aspect of the present invention, there is provided a PC card in accordance with the first aspect of the present invention, wherein the first RAM has a processing speed higher than that of the second RAM.

According to a further aspect of the present invention, there is provided a PC card in accordance with one of the first and second aspects, wherein when a part of data in the flash memory is rewritten, data of one block including data for which a write request has been issued is read from the flash memory, a predetermined amount of data including data for which the write request has been issued in the data of that one block is copied to the first RAM, the other remaining data is copied to the second RAM, and data in the first RAM is rewritten and then the data in the first RAM and the data in the second RAM are written at the original positions of the flash memory.

According to a still further aspect of the present invention, there is provided a PC card in accordance with one of the first to third aspects of the present invention, comprising: a control apparatus for controlling the flash memory and the second RAM, and the first RAM is contained in the control apparatus.

According to a still further aspect of the present invention, there is provided a PC card in accordance with the fourth aspect of the present invention, wherein the control apparatus comprises a register, and when all data of one block read out from the flash memory is copied to the second RAM, the position at which data to be copied to the first RAM is stored in the second RAM is determined and the reference value of the position is stored in the register.

According to a still further aspect of the present invention, there is provided a PC card in accordance with the fifth aspect of the present invention, further comprising: a determination section for determining whether data read out from the flash memory should be copied to the first RAM in accordance with the stored contents of the register when the predetermined amount of data is written in the first RAM.

With the above-described arrangement of the present invention, when reading and writing of data from and into a flash memory having a large capacity is performed in response to a request from a system main unit, a PC card can be made to serve as non-volatile recording means in place of a magnetic disk, and it becomes possible to use it as an external storage unit of a computer system.

In an ordinary second RAM used in such a PC card, reading and writing of data of one byte can be performed; however, in the flash memory, reading and writing can be performed with one block of the consecutive addresses in the storage area being one unit.

However, since the input and output unit of a hard disk unit is one sector, which is smaller than the amount of data of one block thereof, in order to handle the PC card in the same way as for the hard disk unit when seen from the system main unit side, it is necessary to perform data input and output in units of one sector for the flash memory as well.

In the PC card of the present invention, since data of one block including data to be read is read out from a flash memory, a predetermined amount of data (e.g., an amount of data of one sector) including the relevant data is written in a first RAM, and the remaining data is written in a second RAM, it is possible to read out necessary data from a first RAM rather than from a second RAM when the system main unit performs data input/output of one sector.

When it is desired to rewrite data in the flash memory, data of one block including data to be rewritten in the flash memory is read out, a predetermined amount of data (e.g., an amount of data of one sector) including the relevant data from among the data in one block thereof is written in a first RAM, the rest of the data is written in a second RAM, data in the first RAM is rewritten on the basis of the data input from the system main unit, and the data in the first RAM and the data in the second RAM are written at the original addresses in the flash memory. Therefore, the system main unit can rewrite the data in the flash memory merely by performing an input/output operation between the system main unit and the first RAM.

As described above, reading of data from the flash memory and rewriting of data in the flash memory are performed in such a way that data of one block including at least relevant data is read from the flash memory and temporarily stored in a first RAM in order to perform an input/output operation. Therefore, if RAM is used in which the data input/output operation can be performed at a high speed, it is possible to speed up the overall data input/output between the system main unit and the PC card.

The storage capacity of the first RAM used for such temporary storage needs only a capacity of approximately the same degree (at least the same amount, several times as great at most) as one unit (one sector) at which the hard disk performs a data input/output operation in a case in which the PC card is assumed to be a hard disk when seen from the system main unit. Therefore, if the PC card is contained within a control device (control element), the PC card does not become enlarged.

In a case in which a register is provided in the control device and all data of one block read out from the flash memory is to be copied to the second RAM, if position in the second RAM at which the data to be copied to the first RAM should be stored is determined beforehand, and the reference value of that position is stored in the register, it becomes possible to determine whether the data read out from the flash memory should be stored in the second RAM or in the first RAM without performing complex calculations.

If data of one block read out from the flash memory is copied to the first and second RAMs on the basis of such determination, only data input/output to and from the first RAM is required when the system main unit performs reading and writing of an amount of data of one sector.

The above and further objects, aspects and novel features of the invention will become more apparent from the following detailed description when read in connection with the accompanying drawings.

DESCRIPTION OF THE PREFERRED EMBODIMENT

The preferred embodiment of the present invention will be described below with reference to the accompanying drawings.

Figure 1:
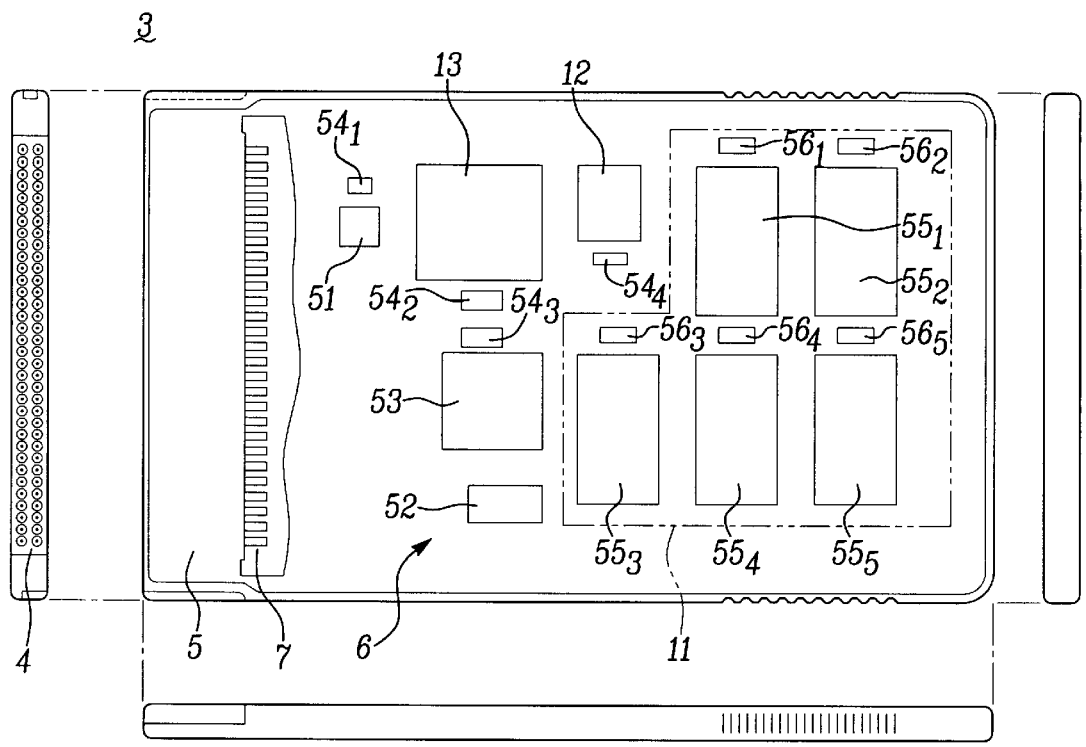
FIG. 1 is an exterior view of an example of a PC card according to the present invention.

Referring to FIG. 1, reference numeral 3 denotes a PC card according to an embodiment of the present invention. The PC card 3 is formed in the shape of a thin card having outer dimensions of 54 mm×85 mm and a thickness of approximately 3.3 mm, with a pin 4 through which the PC card can be releasably connected to the system main unit being provided on one side of the PC card.

The interior of the PC card 3 is divided into a connection section 5 and a base section 6. Provided on the base section 6 are a flash memory 11, a second RAM 12 formed of a general-purpose RAM, a control element (control device) 13, an MPU 53, a power-supply IC 51, a quartz oscillator 52, and capacitors $54_1$ to $54_4$.

The flash memory 11 includes five flash memories $55_1$ to $55_5$, and five capacitors $56_1$ to $56_5$, and a storage area of contiguous addresses is formed by each of the flash memories $55_1$ to $55_5$.

The control device 13 is formed of a gate array, a terminal 7 is provided between the connection section 5 and the base section 6, and wiring connected to the control device 13 is connected to each pin 4 via the terminal 7. When the PC card 3 is loaded into the system main unit 15 by using each pin 4, signals can be transmitted and received between the system main unit 15, and the second RAM 12, the flash memory 11 and the MPU 53.

Figure 2:
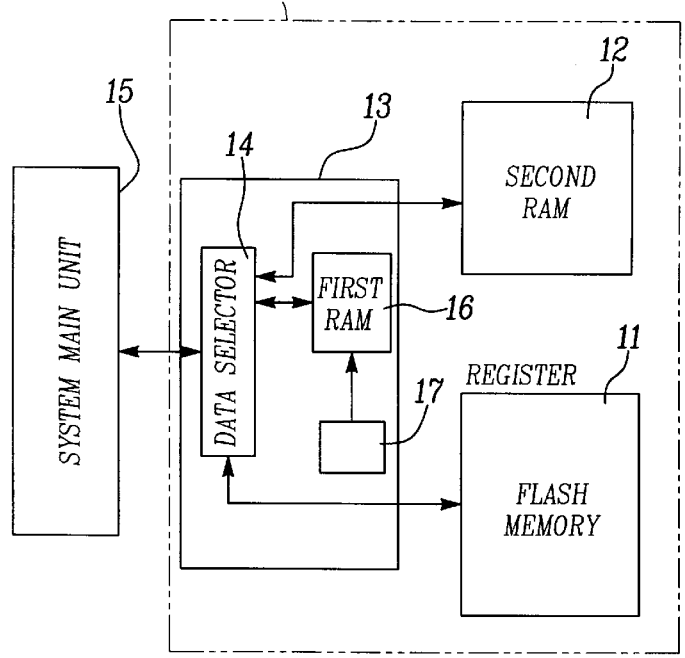
FIG. 2 is a block diagram of the example of the PC card according to the present invention.

The circuit block diagram of such PC card 3 is shown in FIG. 2. Although the MPU 53 is connected to the control device 13 and the quartz oscillator 52 is connected to the MPU 53, the illustration thereof is omitted in FIG. 2.

The control device 13 includes a data selector 14, a first RAM 16 (a built-in RAM), and a register 17. For the first RAM 16, a small-capacity RAM having a processing speed higher than that of the second RAM 12 is used and connected to the data selector 14 inside the control device 13. Further, the register 17 is connected to the first RAM 16.

The second RAM 12 and the flash memory 11 in the outside of the control device 13 are connected to the data selector 14. Data input/output between these and the system main unit 15 is performed via the data selector 14.

In a case in which 256 bytes×2=512 bytes are assumed to be one sector and one sector×8=4096 bytes to be one block, data input/output is performed between the PC card 3 and the system main unit 15 with the data amount of one sector being one unit. On the other hand, the flash memory 11 is structured in such a way that data input/output is performed with the data amount of one block being one unit.

Figure 3:
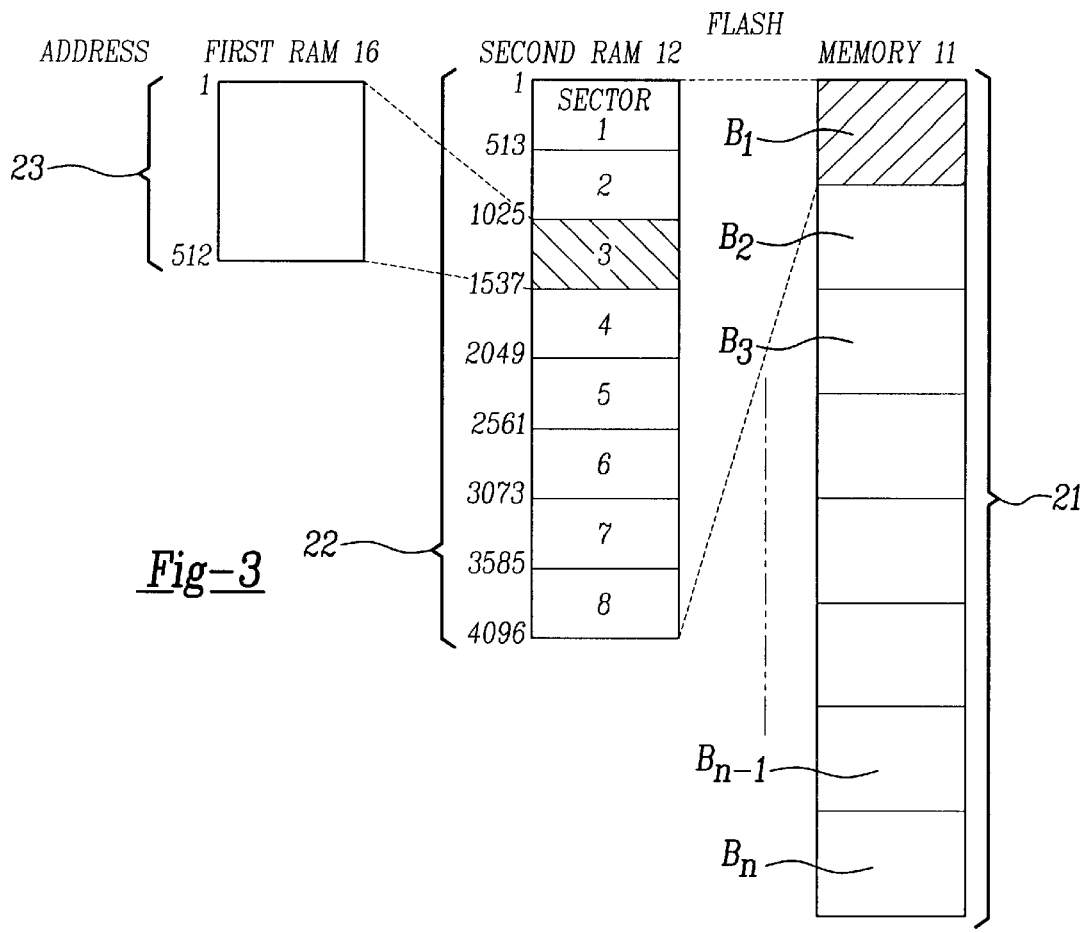
FIG. 3 shows a storage area of each device used in the PC card according to the present invention.

FIG. 3 shows an image view of the storage area of each device. A storage area 21 of the flash memory 11 has a storage capacity of 4096×n bytes, and n blocks $B_1$ to $B_n$ are assigned in sequence to the contiguous addresses for each storage capacity of one block.

A storage area 22 of the second RAM 12 has a capacity of 4096 bytes, which is the storage capacity of one block, and is structured in such a way that when data of one block is read out from the flash memory 11, all of the data of that one block can be stored in the second RAM 12. However, in practice, the remaining data excluding the data transferred to the first RAM 16 is stored (the space of one sector becomes free).

In the second RAM 12, address 1 to address 4096 are assigned consecutively byte by byte, and eight sectors of sector 1 to sector 8 are assigned for each storage capacity of one sector.

On the other hand, a storage area 23 of the first RAM 16 has a capacity of 512 bytes, which is the storage capacity of one sector. Since one unit of data input/output performed by the system main unit 15 is one sector, the first RAM 16 is structured in such a way that the first RAM 16 can store all data which is read and written by the system main unit 15. The storage area of the first RAM 16 is assigned to contiguous addresses 1 to 512 for each byte.

Assuming that data for which a read request has been issued from the system main unit 15 is positioned in sector 3 of block $B_1$ in the storage area 21 of the flash memory 11, data input/output will be described below with reference to the timing chart shown in FIG. 4.

In this case, as a destination where data is written, the second RAM 12 is selected by the data selector 14, and as a destination where data is read, address 1 in this flash memory 11 is set. Data is read out by the control device 13 in sequence byte by byte starting from the beginning of block $B_1$ of the flash memory 11, and data from the beginning (first byte) to the 512th byte is written in sequence byte by byte at address 1 to address 512 of the storage area 22 in the second RAM 12.

Then, data from the 513th byte to the 1024th byte of block $B_1$ is read out and written at address 513 to address 1024 of the storage area 22 in the second RAM 12. This completes the reading and writing of data in the portion corresponding to sectors 1 and 2 of block $B_1$.

Next, before data in the portion corresponding to sector 3 of the flash memory 11 where there is data desired to be read out is read out, the data selector 14 changes the writing destination from the second RAM 12 to the built-in RAM 16.

When data of the 1025th byte at the beginning of sector 3 of block $B_1$ is read out, the data is written at address 1 of the storage area 23 of the first RAM 16, and data in the sector 3 portion of block $B_1$ is written in sequence byte by byte at the address of the storage area 23 of the first RAM 16.

When the reading and writing of data of the 1536th byte, which is the last data of sector 3 of block $B_1$, terminates, the data selector 14 changes the data writing destination from the first RAM 16 to the second RAM 12.

Then, when data of the 1537th byte corresponding to the beginning of sector 4 of block $B_1$ is read, the data is written at address 1537 of the storage area 22 of the second RAM 12. Thereafter, data up to the data of the 4096th byte, which is the last data of sector 8 of block $B_1$ is written in sequence byte by byte at address 1537 to address 4096 of the storage area of the second RAM 12.

In the manner described above, data corresponding to the positions of sectors 1, 2, and 4 through 8 in the block $B_1$ is written in the storage area 22 of the second RAM 12. On the other hand, only the data of sector 3 of block $B_1$ where the data for which a read request has been issued is positioned, is written in the first RAM 16.

Figure 4:
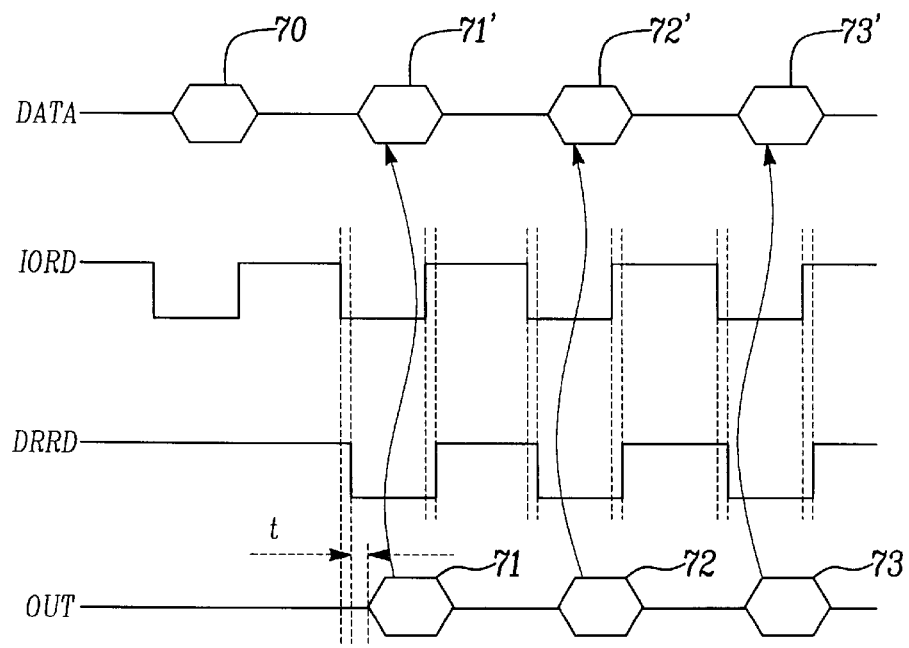
FIG. 4 is a timing chart illustrating the timing at which a system main unit 15 reads data in the PC card according to the present invention.

Upon the termination of the above process, as shown in FIG. 4, a status register (not shown) is set in a reading completed state, and a signal 70 indicating that state is output to a data bus (Data) between the system main unit 15 and the PC card 3.

When the system main unit 15 monitoring the above-described status register reads out such state, the main unit makes a read signal (IORD) fall to a low state at a predetermined timing. When the first RAM read signal (DRRD) reaches a low state after being slightly delayed, data within address 1 in the storage area of the first RAM 16 is first output to a small-capacity data bus (OUT) 71, and then the data is output to a data bus (Data) 71' via the data selector 14 and read by the system main unit 15.

After the data of address 1 is read by the system main unit 15, the system main unit 15 makes the read signal (IORD) fall to a low state; when the first RAM read signal (DRRD) reaches a low state after being slightly delayed, data of address 2 of the first RAM 16 is output to the small-capacity data bus (OUT) 72, and the data is output to a data bus (Data) 72' via the data selector 14 and read by the system main unit 15.

In this way, data of address 1 to address 512 in the first RAM 16 is output in sequence byte by byte to the data bus (Data) and read by the system main unit 15.

In such a case, the time t from when the first RAM read signal (DRRD) reaches a low state until the data in the first RAM 16 is output to the small-capacity data bus (OUT) is 20 nanoseconds; however, when the normal second RAM is used instead of the first RAM, approximately 70 nanoseconds of time required. Therefore, the sum of time of delay in a case in which data of 512 bytes (data of one sector) is output has a difference of (70 nanoseconds−20 nanoseconds) ×512=25.6 microseconds between the first RAM 16 and the second RAM 12.

Although the above-described control device 13 is formed of a gate array, the present invention is not limited to this example. Further, a value which is used as a base when the data in the first RAM 16 is made to correspond to the addresses in the second RAM 12 may be stored in the above-described register 17.

Figure 5A:
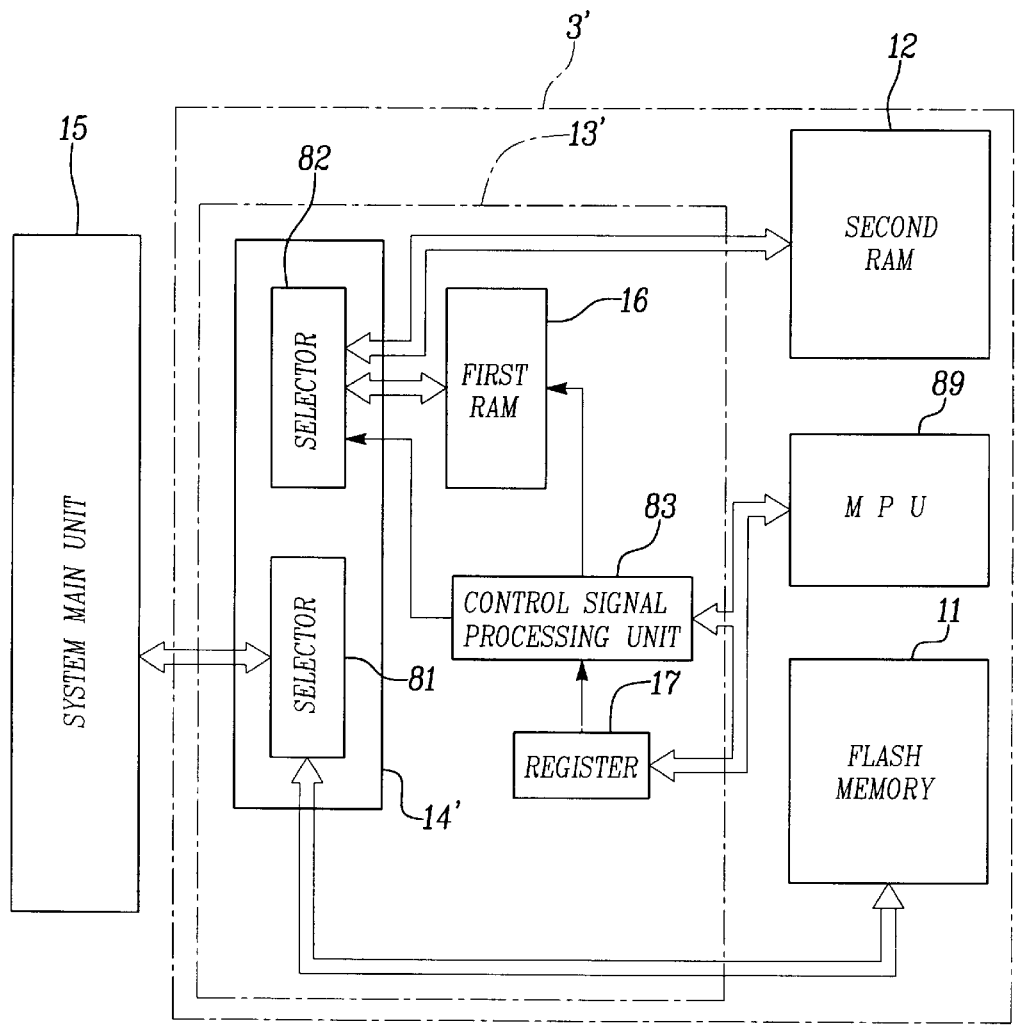
FIG. 5A shows an example of a control apparatus according to the present invention.
Figure 5B:
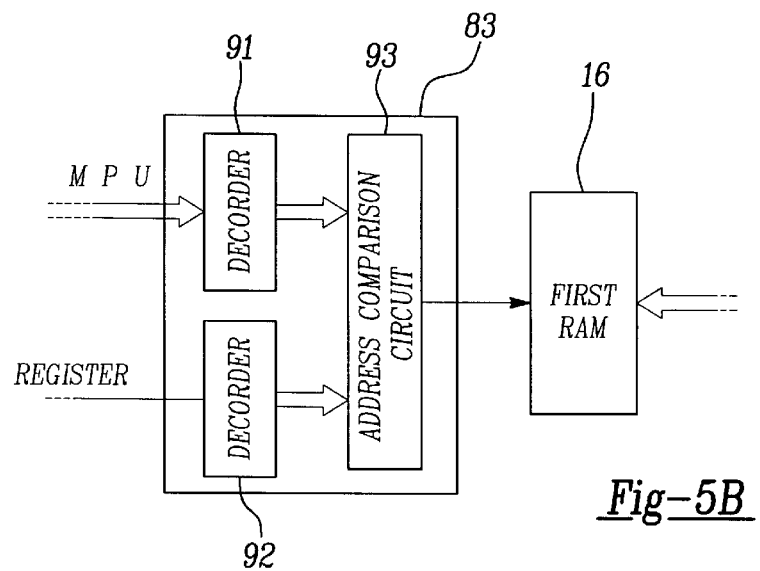
FIG. 5B shows the operation of a control signal processing circuit according to the present invention.
Figure 6:
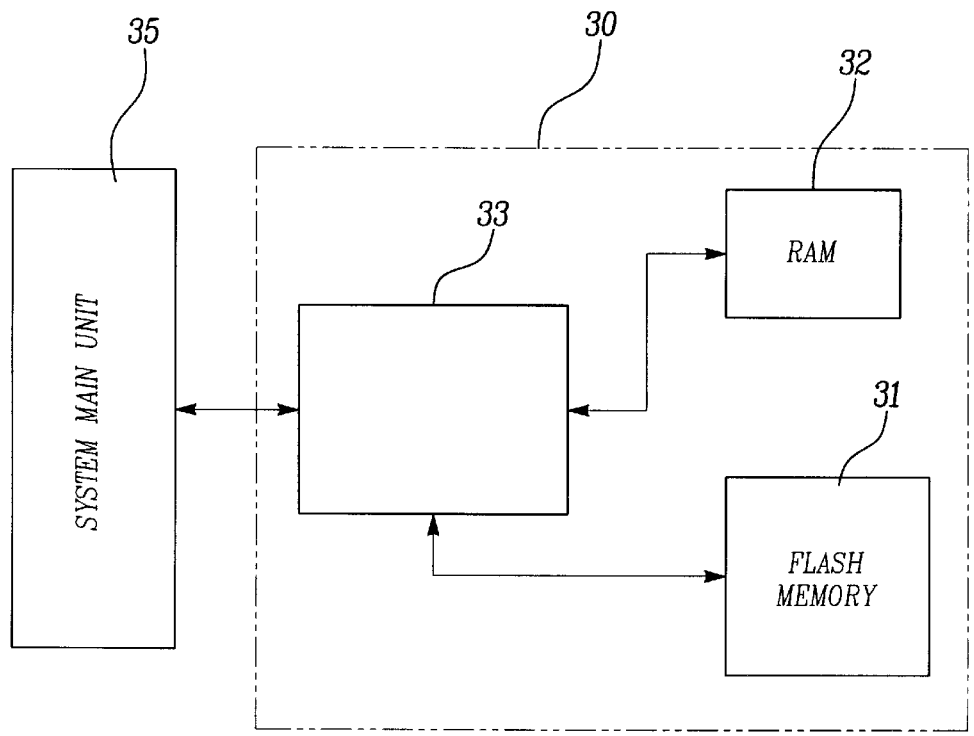
FIG. 6 is a block diagram illustrating a conventional PC card.
Figure 7:
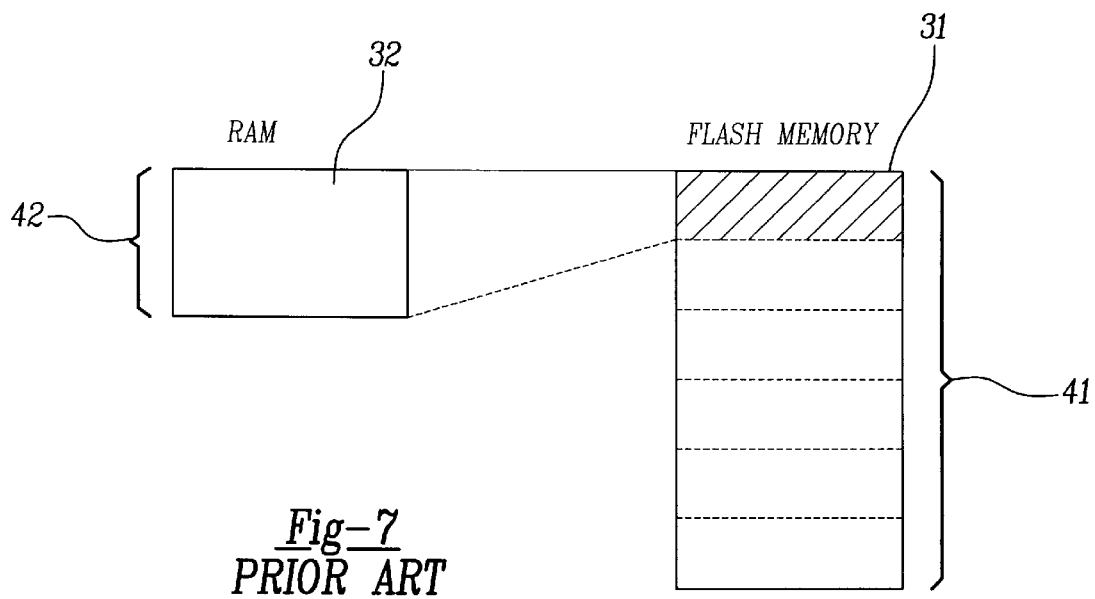
FIG. 7 shows a storage area of each device used in the conventional PC card.

The arrangement in such a case will now be described with reference to FIGS. 5A and 5B. Components in a PC card 3' shown in FIG. 5A which are the same as those of FIG. 2 are given the same reference numerals and, therefore, a description thereof is omitted.

This PC card 3' differs from the PC card 3 in that in addition to the second RAM 12 and the flash memory 11, an MPU 89 is provided, a control apparatus 13' includes a control signal processing circuit 83 in addition to the first RAM 16 and the register 17, and selectors 81 and 82 are provided in the data selector 14'.

The system main unit 15 and the PC card 3' are structured in such a way that data input/output is performed between them via the selector 81, and in the PC card 3', the MPU 89 controls data input/output between the system main unit 15 and the flash memory 11.

The data input/output will now be described specifically. When it is assumed that data for which a read request has been issued from the system main unit 15 is positioned in sector 3 of block $B_1$ of the flash memory 11, in a case in which all data of block $B_1$ is to be copied to the second RAM 12, the values (the sector specification value, the address data, and so on) indicating the position of data at the beginning of sector 3 in the second RAM 12 are set in the register 17.

Then, when data of block $B_1$ is actually read out from the flash memory 11 and copied to the second RAM 12, the MPU 89 outputs the value indicating the position of the data of one block to be copied in the second RAM 12 to the control signal processing circuit 83.

At this time, a value indicating the position corresponding to the beginning position of sector 3 in the second RAM 12 has been input to the control signal processing circuit 83 from the register 17. The control signal processing circuit 83, as shown in FIG. 5B, has decoders 91 and 92, and the values indicating those positions are compared by an address comparison circuit 93, which is a determination section, via the decoders 91 and 92.

The comparison result formed by the address comparison circuit 93 indicates whether the data read out from the flash memory 11 is data of sector 3 or data of the other sectors. When the control signal processing circuit 83 outputs the comparison result to the first RAM 16 and the selector 82 in the control apparatus 14', the first RAM 16 is set to a write enabled state or a write disabled state according to the instruction of the comparison result. On the other hand, the selector 82 routes the copying destination to the first RAM 16 or the second RAM 12 on the basis of the comparison result.

With such control, when data read from the flash memory 11 is present in sector 3, the first RAM 16 is set to a write enabled state, and the copying destination is changed from the second RAM 12 to the first RAM 16. When the copying of data of sector 3 to the first RAM terminates, the first RAM 16 is set to a write disabled state, and the copying destination is changed to the second RAM 12.

Since the system main unit 15 then reads out data from the high-speed first RAM 16, it is possible to perform high-speed reading of data.

The above describes a case in which data for which a read request has been issued from the system main unit 15 is present in the sector 3 of block B' of the flash memory 11.

However, the data selector 14 can select a block in which data required by the system main unit 15 is positioned from among block $B_1$ to block $B_n$ and read said data. When data written in that block is to be copied, data of the sector, including data for which a read request has been issued, is written at address 1 to address 512 of the storage area 23 of the first RAM 16. Therefore, since even when data for which a read request has been issued from the system main unit 15 is at any position in the storage area 21 of the flash memory 11, the data is copied to the first RAM 16, the system main unit 15 can read data from the first RAM 16. Therefore, since data transfer from the PC card 3 to the system main unit 15 is performed from the first RAM 16, reading of data can be performed at a higher speed.

Further, since the sector including data for which a rewrite request has been issued is not written in the second RAM 12, but is written in the first RAM 16, the rewriting time is also shortened, resulting in an overall increased processing speed.

The case of rewriting data in the flash memory 11 is the same as a case in which a read request occurs in that the block including data for which a rewrite request has been issued is read out, data of the sector including the data to be rewritten in the block is written in the first RAM 16, and data of the other sectors is written in the second RAM 12. However, since data in the storage area 23 of the first RAM 16 is rewritten, data in the storage areas 22 and 23 of the first RAM 16 and the second RAM 12 is read byte by byte, and the data is written at the original position in the flash memory 11 on the basis of data input from the system main unit 15, the data rewriting time is shortened by an amount corresponding to the amount in which the rewriting and reading time of the first RAM 16 is faster than that of the second RAM 12 as compared with a case in which the first RAM 16 is not used.

In the present invention, reading of data from the flash memory is performed at a high speed, and further rewriting and writing of data into the flash memory is performed at a high speed. If the first RAM is contained in the control apparatus, the PC card does not become enlarged.

In a case in which a register is provided in the control apparatus and data read out from the flash memory is copied, if the data is allocated to the first RAM and the second RAM on the basis of the value of the register, complex calculations are not required, and copying speed increases.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A PC card which has a flash memory structured to perform data input/output in units of an amount of data of one block and which is structured so as to be capable of performing data input/output in units of an amount of data of one sector, where a predetermined amount of data is assumed to be one sector and an amount of data consisting of an integer multiple of said one sector to be one block, said PC card comprising:

a first RAM in which reading and writing can be performed in an amount of data smaller than that of said one block; and a second RAM having a storage capacity for said one block or more; whereby data of said one block, including data for which a read request has been issued, is read from said flash memory;

a given amount of data, including said data for which said read request has been issued in the data of said one block, is copied to said first RAM;

other remaining data is copied to said second RAM; and data of one sector, including data for which a read request has been issued, is output from said first RAM.

2. A PC card according to claim 1, wherein said first RAM has a processing speed higher than that of said second RAM.

3. A PC card according to claim 1 wherein:

when a part of data in said flash memory is rewritten, data of one block, including data for which a write request has been issued, is read from said flash memory;

a predetermined amount of data, including data for which the write request has been issued in the data of said one block, is copied to said first RAM;

other remaining data is copied to said second RAM; and said data in said first RAM is rewritten and then said data in said first RAM and said data in said second RAM are written at their original positions of said flash memory.

4. A PC card according to claim 1, comprising:

a control apparatus for controlling said flash memory and said second RAM; and said first RAM being contained in said control apparatus.

5. A PC card according to claim 4, wherein said control apparatus comprises a register, and when all data of one block read out from said flash memory is copied to said second RAM, a position at which data to be copied to said first RAM is stored in said second RAM is determined and a reference value of said position is stored in said register.

6. A PC card according to claim 5, further comprising:

a determination section for determining whether data read out from said flash memory should be copied to said first RAM in accordance with stored contents of said register when said predetermined amount of data is written in said first RAM.

7. A PC card comprising:

a first RAM for reading and writing less than one block of data;

a second RAM for storing at least one block of data; and a flash memory for performing data input/output in units of one block or one sector;

whereby when one block of data is read from said flash memory:

a given amount of block data, including read requested data, is copied to said first RAM;

remaining block data is copied to said second RAM; and one sector of block data, including the read requested data, is output from said first RAM.

8. The PC card of claim 7 wherein said first RAM has a processing speed greater than a processing speed of said second RAM.

9. The PC card of claim 7 wherein:

a predetermined amount of block data, including write requested block data, is copied to said first RAM and rewritten;

remaining block data is copied to said second RAM; and said predetermined amount of block data and said remaining block data are then written to their original positions of said flash memory.

10. The PC card of claim 7 further comprising a control apparatus containing said first RAM for controlling said flash memory and said second RAM.

11. The PC card of claim 10 wherein said control apparatus comprises a register for storing a reference value corresponding to a position within said second RAM where data to be copied to said first RAM is stored.

12. The PC card of claim 11 further comprising:

a comparison means for comparing data from said flash memory with criteria stored in said register to determine if said data should be copied to said first RAM.

* * * * *